(12) United States Patent
Chen et al.

(10) Patent No.: US 6,178,132 B1
(45) Date of Patent: Jan. 23, 2001

(54) NON-VOLATILE INTEGRATED CIRCUIT HAVING READ WHILE WRITE CAPABILITY USING ONE ADDRESS REGISTER

(75) Inventors: Han Sung Chen, Keelung; Chun Hsiung Hung, Hsinchu; Kuo Yu Liao, Panchiao, all of (TW); Ray Lin Wan, Fremont, CA (US)

(73) Assignee: Macronix International Co., Ltd., Hsinchu (TW)

( * ) Notice: Under 35 U.S.C. 154(b), the term of this patent shall be extended for 0 days.

(21) Appl. No.: 09/391,917

(22) Filed: Sep. 9, 1999

(51) Int. Cl.[7] ................................................. G11C 8/00
(52) U.S. Cl. ................................. 365/230.02; 365/185.11
(58) Field of Search .......................... 365/230.02, 185.11, 365/185.14, 185.28, 185.29, 189.01, 189.02

(56) References Cited

U.S. PATENT DOCUMENTS

| | | | |
|---|---|---|---|
| 5,043,947 | * 8/1991 | Oshima et al. | 365/230.03 |
| 5,245,572 | 9/1993 | Kosonocky et al. | 365/189.02 |
| 5,361,343 | * 11/1994 | Kosonocky et al. | 365/230.03 |
| 5,732,017 | * 3/1998 | Schumann et al. | 365/185.11 |
| 5,841,696 | * 11/1998 | Chen et al. | 365/185.11 |
| 5,867,430 | * 2/1999 | Chen et al. | 365/189.04 |

* cited by examiner

Primary Examiner—Richard Elms
Assistant Examiner—Anh Phung
(74) Attorney, Agent, or Firm—Mark A. Haynes; Haynes & Beffel LLP

(57) ABSTRACT

A non-volatile integrated circuit memory, such as a flash memory device based on floating gate transistor memory cells, with read while write capability is provided using a single address register. The integrated circuit includes at least two independent arrays of memory cells. During a program or an erase operation in one array on the non-volatile integrated circuit, a read operation can be executed in the other array on the same integrated circuit by bypassing the address register altogether, and allowing the register to remain in use by the program or erase operation. A bypass combinatorial logic path for the read process is coupled to the same address inputs as the address register, and operable in parallel with the registered address path.

12 Claims, 2 Drawing Sheets

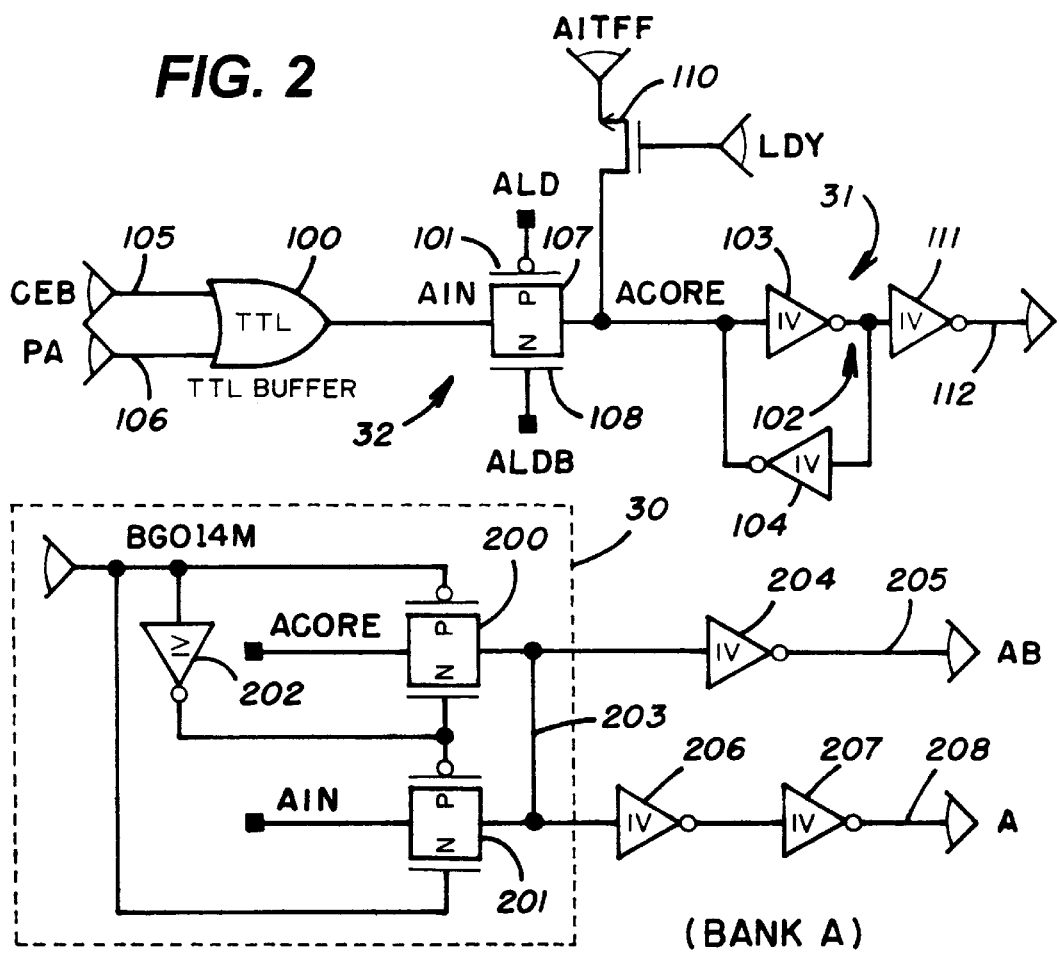
FIG. 2
FIG. 3
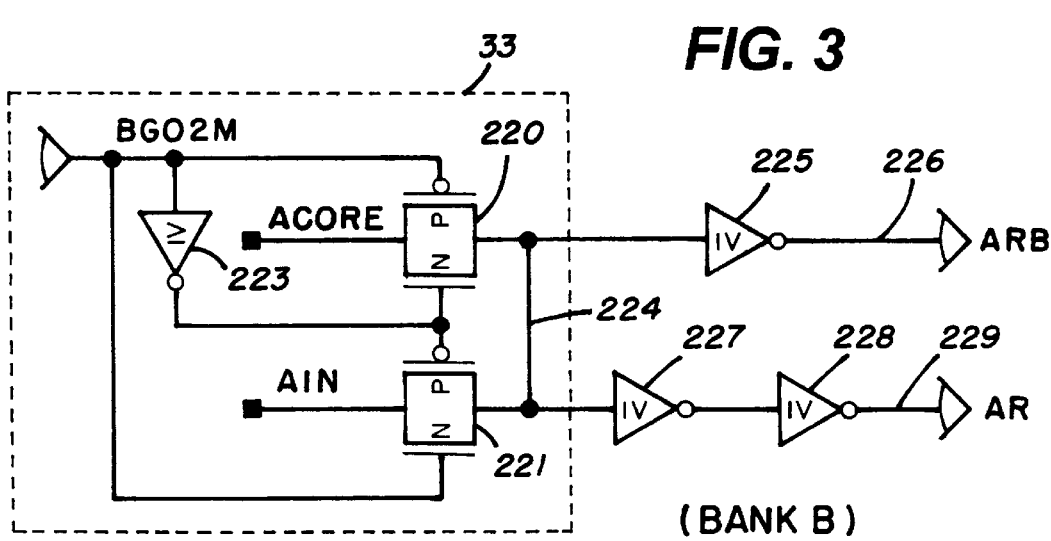
FIG. 4

NON-VOLATILE INTEGRATED CIRCUIT HAVING READ WHILE WRITE CAPABILITY USING ONE ADDRESS REGISTER

BACKGROUND OF THE INVENTION

1. Field of the Invention

The present invention relates to non-volatile memory devices, such as flash memory based on floating gate memory transistors; and more particularly to processes for reading data from a non-volatile memory device while writing data to the same device.

2. Description of Related Art

One class of non-volatile memory device is referred to as flash memory. Flash memory is electrically erasable and programmable. The erase process in flash memory is applied to large blocks of cells at the same time, and has been called flash erase. Flash memory devices are typically manufactured using floating gate transistors, in which the erase process requires a significant amount of time to execute. By erasing a large block of memory cells at the same time, significant speed improvement is provided over other types of non-volatile memory devices using floating gate transistors. Also, the process of programming data in flash memory devices is a relatively time-consuming process.

One disadvantage of traditional flash memory arises from the relatively time-consuming processes of erasing and programming the devices. While these processes are being executed at one addressed location on the device, the rest of the memory cannot be used. The host processor is often idle while the flash memory is being programmed or erased.

Technology has developed to allow reading data from one set of memory cells on an integrated circuit while erasing or programming another set of memory cells. This prior art is represented by U.S. Pat. No. 5,245,572, entitled FLOATING GATE NON-VOLATILE MEMORY WITH READING WHILE WRITING CAPABILITY. Read while write capability allows the host processor to use the memory device for specific kinds of access, even while programming or erasing operations are occurring.

The prior art approaches require two separate memory arrays, having independent address decoders. In addition, the prior art approaches require separate address registers connected to the address inputs on the device, for the respective address decoders. Having the parallel address registers, address decoders, memory array structures allows the control logic on the chip to execute one process on one of the parallel arrays, while allowing the reading data from another of the parallel arrays. However, this duplicity comes at the cost of additional area and complexity on the integrated circuit, and consequently additional cost in manufacturing.

Therefore, it is desirable to provide non-volatile memory integrated circuit which is capable of reading while writing, which has a more efficient implementation, and which consumes less area on the integrated circuit.

SUMMARY OF THE INVENTION

The present invention provides a more efficient read while write implementation and process for non-volatile integrate circuits. In particular, a non-volatile integrated circuit memory, such as a flash memory device based on floating gate transistor memory cells, with read while write capability is provided using a single address register. The integrated circuit includes at least two independent arrays of memory cells. During a program or an erase operation in one array on the non-volatile integrated circuit, a read operation can be executed in the other array on the same integrated circuit by bypassing the address register altogether, and allowing the register to remain in use by the program or erase operation. A bypass combinatorial logic path for the read process is coupled to the same address inputs as the address register, and is operable in parallel with the registered address path.

In one aspect of the invention, a non-volatile memory device is provided that comprises an integrated circuit substrate having a plurality of arrays of memory cells, including a first array of memory cells having a first address extent and a second array of memory cells having a second address extent. First and second address decoders are coupled to the first and second arrays, respectively. Control logic and bias resources on the integrated circuit substrate are coupled to the first and second memory arrays, and execute program and erase operations in response to commands on one of the first and second arrays, and execute read operations on the other of the first and second arrays during the execution of the program and erase operations. The integrated circuit substrate includes a set of address inputs and an address register. Selector circuitry responsive to the control logic operates to connect the set of address inputs to a first selected target selected from the address register, the first address decoder and the second address decoder. The selector circuitry also operates to connect the address register to a second selected target selected from the first address decoder and the second address decoder. During a program or erase operation, the address register is connected to the address decoder of the array being program or erased. The address inputs are isolated from the address register, and connected to the other address decoder coupled to the other array. When an address is received identifying the other array for a read, then the read is executed. This structure may be extended to provide for read while write capability with any number of independently addressable arrays on the integrated circuit.

According to one aspect of the invention, an address counter is included on the integrated circuit substrate, and connected with the address register. The address counter is controlled by the control logic during the erase or program operation, and applies addresses to the address register in support of such operations.

In another aspect, the integrated circuit substrate includes command decoder logic, which is coupled to the address register. Commands identifying the erase and program operations in this aspect of the invention include address sequences, which are supplied from the address register to the command decoder logic. The read process is executed without an address sequence based command. Rather, in one embodiment, the read process occurs whenever an address is received identifying a memory location in the array that is not subject to the erase or program operation, optionally in combination with enable signals which are independent of the address path.

The selector circuit in one embodiment includes an address input switch. The address input switch has a control input coupled to the control logic. An address input on the address input switch is coupled to the set of address inputs on the integrated circuit. An output of the address input switch is coupled to the address register. The address input switch either connects the address inputs to the address register or disconnects the address inputs from the address register in response to the control signal.

The selector circuit also includes first and second multiplexers. The multiplexers have respective control inputs connected to the control logic, address inputs coupled to the set of address inputs and to the address register, and an output connected to the respective one of the first and second address decoders. The multiplexers operate to connect either the address register or the address inputs to the respective address decoders in response to the respective control inputs.

In one embodiment, the address input switch comprises for each address input in the set, a logic gate having a first input coupled to an enable signal and a second input coupled to an address input, and a pass gate having an input coupled to the output of the logic gate and an output coupled to the address register. The pass gate is responsive to the signal on the switch control input to connect the output of the pass gate to the address register or to disconnect the output of the logic gate from the address register.

In one embodiment, each of the multiplexers is implemented with first and second pass gates. The input of the first pass gate is connected to the address input, such as at the output of the logic gate referred to above. The second pass gate has its input connected to the address register. The outputs of both pass gates are connected to the respective address decoders.

Therefore, the present invention provides an integrated circuit with read while write capability that is less complex, consumes less area on the integrated circuit, and can be manufactured at less cost than prior art implementations. The invention is particularly suited to high-density, flash memory devices using floating gate memory cells, and having more than one independently addressable array.

BRIEF DESCRIPTION OF THE DRAWINGS

FIG. 2 is a schematic diagram of an address input switch and an address register for a single address bit, according to a preferred embodiment of the present invention.

FIG. 3 is a schematic diagram of a first address multiplexer for use in combination with the address input switch of FIG. 2.

FIG. 4 is a schematic diagram of a second address multiplexer for use in combination with the address input switch of FIG. 2.

DETAILED DESCRIPTION

Figure 1:
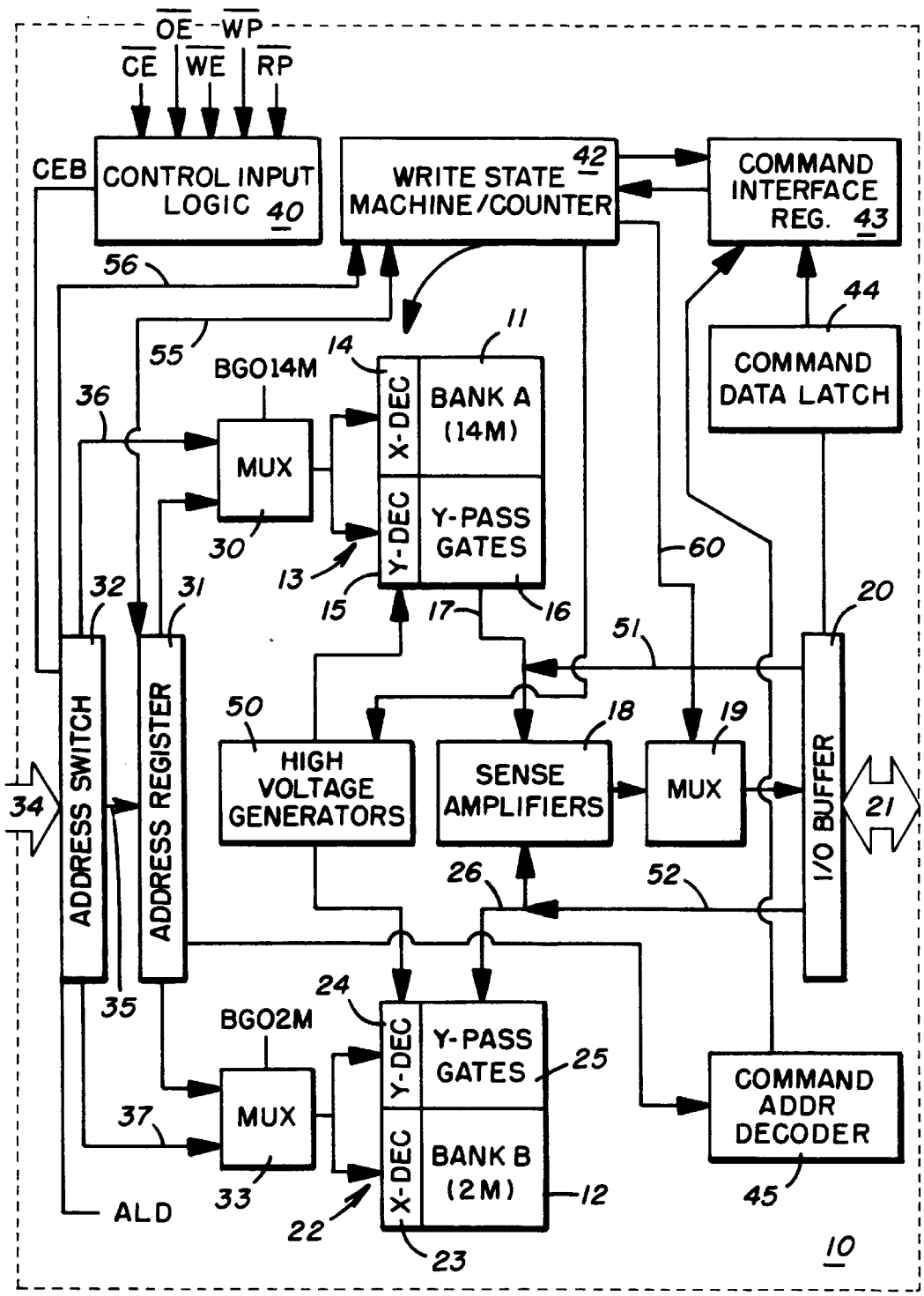
FIG. 1 is a block diagram of flash memory integrated circuit including the read while write capability of the present invention using only one set of address registers.

A detailed description of the present invention is provided with respect to FIGS. 1–4.

FIG. 1 shows a simplified diagram of a non-volatile memory device, such as a flash memory integrated circuit based on floating gate memory cells, including the read while write capability of present invention.

The integrated circuit includes a substrate 10. A plurality of arrays of memory cells are formed on the substrate 10. In this embodiment, bank A comprises a first array 11 of floating gate memory cells, and bank B comprises a second array 12 of floating gate memory cells. The first array in this example includes 14 Mbits of storage, and the second array 12 includes 2 Mbits of storage. Other configurations of memory arrays can be utilized as suits the needs of a particular implementation. For example, in some embodiments, more than 2 arrays are provided. Also in some embodiments, the arrays are equal in size.

A first address decoder 13 is coupled with the first array 11. The first address decoder 13 includes an X-decoder 14 and a Y-decoder 15. The Y-decoder is coupled to a set of Y-pass gates 16. The X-decoder is coupled to the word lines in the array 11. The Y-pass gates 16 are connected to the bit lines in the array 11.

The first array 11 is connected on line 17 to a set of sense amplifiers 18. The sense amplifiers 18 are connected to a multiplexer 19, the output of which is connected to an input/output buffer 20. The multiplexer receives the contents of a status register (not shown) and control signals on line 60. Thus, output from the array and from the status register is available. The output of the input/output buffer 20 is connected to a set of output pins 21 on the integrated circuit.

A second address decoder 22 is coupled to the second array 12. The second address decoder includes an X-decoder 23 and a Y-decoder 24. The Y-decoder 24 is coupled with the set of Y-pass gates 25. The Y-pass gates 25 are coupled to the bit lines in the array 12. The X-decoder 23 is coupled to the word lines in the array 22. The second array 12 is connected on line 26 to the set of sense amplifiers 18.

An input data path is provided from the input/output buffer 20 across line 51 to the first array 11 and across line 52 to the second array 12. Data in structures are associated with each array for accepting the data during the program processes.

The address decoder 13 coupled to the first array 11 receives addresses from the output of a multiplexer 30. The inputs to the multiplexer 30 include signals from an address register 31 and an address switch 32. Likewise, the address decoder 22 coupled to the second array 12 receives addresses from the output of a multiplexer 33. The inputs to the multiplexer 33 include the address register 31 and the address switch 32.

The address switch 32 is connected to a set 34 of address inputs for the integrated circuit. The address switch 32 supplies the address signals on the set of inputs 34 to the address register on line 35, to the multiplexer 30 on line 36 and to the multiplexer 33 on line 37.

An enable signal CEB is applied to the address switch 32. The enable signal CEB is generated by the control input logic 40 on the integrated circuit. The control input logic 40 receives a set of control signals CE, OE, WE, WP, RP from sources external to the integrated circuit in this embodiment.

The address switch 32 is also controlled by a control signal ALD which is generated by control logic on the integrated circuit. The address switch 32 is enabled to supply address signals on lines 36 and 37, and on line 35 in response to the enable signal CEB. The address switch 32, when enabled, connects the address signals on the inputs 34 to the address register 31 or disconnects the address signals on the inputs 34 from the address register 31 in response to the control signal ALD.

The multiplexer 30 which is coupled with the first array 1 receives a control signal BGO14M from the control logic on the integrated circuit. Likewise, the multiplexer 33 coupled with the second array 12 receives a control signal BGO2M from the control logic on the integrated circuit.

The control logic on the integrated circuit is distributed in the preferred embodiment. The control logic includes a write state machine and counter 42, a command interface register 43, a command data latch 44, and command address decoder 45, and the control input logic 40. The write state machine 42 includes resources for executing an erase process and a program process on the floating gate memory devices in the first and second arrays 11, 12. Bias resources are also on the integrated circuit, including high voltage generators 50, and other voltage sources not shown used for executing the program, erase and read operations on the first array 11 and second array 12.

In operation, a program or an erase process is initiated in the integrated circuit by receiving a sequence of address and data signals on the address inputs 34 and data inputs 21 which identify the selected process. The address signals are supplied through the address register 31 to a command address decoder 45. The data signals are supplied through the input/output buffer 20 to a command data latch 44. The data from the command address decoder 45 and from the command data latch 44 is supplied to the command interface register 43. The command interface register 43 is coupled to the state machine 42 to cause execution of the process.

During programming, addresses from the address register 31 are applied to the array being programmed. The addresses in the address register 31 are supplied by the address input 34 through the address switch 32, or through the address counter in the write state machine and counter 42 across line 55. A control signal from the state machine 42 is used to select the address source. Likewise, during erasing, an address from the address register 31 is used to identify the block of memory cells to be erased.

The address switch 32 is operable to disconnect the address inputs 34 from the address register 31 during the programming and erasing operations, or at other times as suits a particular implementation.

Thus, address signals addressing an array not being programmed or erased, which are applied to the address inputs 34 during the programming or erasing process of the other array, bypass the address register 31 and are supplied to the multiplexers 30 and 33. If the particular multiplexer 30, 33 is set to accept an address from the address switch 32, then the address is applied to the available one of the address decoders 13, 22 for the one of the first array 11 and second array 12 which is not being used for program or erase operations. A read operation occurs independently of the command sequence of address or data signals. Thus, the command address decoder 45 and command data latch 44 are not needed for the read operation. The chip allows for applying an address to the array not being erased or programmed without storing the address on the integrated circuit. Data is read at the location identified by the address without storing the address on the integrated circuit, and the read data is supplied to the output of the integrated circuit without storing the address on the integrated circuit. Address signals addressing the array being programmed or erased are passed to the write state machine/counter 42 on line 56, which interprets it as a status register read.

Thus, both a registered address path from the address inputs to the address decoders and a combinatorial address path from the same address inputs to the same address decoders are supplied on a single integrated circuit. The combinatorial address path is available for read access to an array on the device while the registered address path is used for slower processes such as program and erase operations.

FIG. 2 provides a schematic diagram of the address switch 32 and address register 31 for one address bit, in a preferred embodiment of the present invention. FIGS. 3 and 4 illustrate preferred embodiments of the multiplexers 30 and 33.

FIG. 2 illustrates the address switch 32 which includes for each address bit, a logic gate 100 and a pass gate 101. The address register 31 for each address bit, includes a latch 102 comprising a first inverter 103 and a second inverter 104 having their respective outputs coupled to the other's input.

In this example, the logic gate 100 comprises an OR-gate having a first input 105 connected to receive the control signal CEB, and a second input 106 connected to receive an address bit PA from an address pin on the integrated circuit. The output of the OR-gate 100 is connected to an input of the pass gate 101. The pass gate 101 includes a p-channel transistor 107 connected in parallel with an n-channel transistor 108. The gate of the p-channel transistor 107 receives the control signal ALD while the gate to the n-channel transistor receives the complement of the control signal ALDB. The output of the pass gate 101 is connected to the input of the inverter 103 of the address latch 102. Thus, the pass gate 101 operates to connect the output of the logic gate 100 to the address register 31 or to disconnect the output of logic gate 100 from the address register 31, in response to the control signal ALD.

The output of the logic gate 100 provides the address input AIN for the combinatorial address path on the integrated circuit to the multiplexers 30, 33 and write state machine/counter 42 of FIG. 1. The address latch 102 supplies the address input ACORE for the registered address path on the integrated circuit.

In addition, a signal AITFF from the address counter in the write state machine 42 for use during program and erase operations is provided through pass transistor 110. The source of transistor 110 is connected to receive the signal AITFF. The drain of the pass transistor 110 is connected to the address latch 102. The gate of the pass transistor 110 receives a control signal LDY from the control logic on the device. In this manner, the address latch 102 receives address signals from the address counter or from the address input for the chip.

The address latch 102 is also coupled to an inverter 111. The output of the inverter 111 is supplied on line 112, which is connected to the command address decoder 45 shown in FIG. 1. Thus, the command address decoder 45 receives the address signal ACORE during the command sequence.

FIG. 3 and FIG. 4 show schematic diagrams of preferred embodiments of the multiplexers 30 and 33 respectively. FIG. 3 illustrates the multiplexer which includes a first pass gate 200 and a second pass gate 201. The first pass gate 200 has a p-channel transistor and an n-channel transistor connected in parallel. The gate of the p-channel transistor receives the control signal BGO14M. The gate of the n-channel transistor receives the complement of the control signal BGO14M from the output of inverter 202. The input of the pass gate 200 is the registered address signal ACORE.

The second pass gate 201 has a p-channel transistor connected in parallel with an n-channel transistor. The gate of the p-channel transistor is connected to the output of the inverter 202. The gate of the n-channel transistor is connected to receive the control signal BGO14M. The input to the second pass gate 201 is the address input AIN.

Thus, the pass gate 200 is conducting when the pass gate 201 is open. Likewise, the pass gate 201 is conducting when the pass gate 200 is open. In this way, the multiplexer 30 supplies the signal ACORE or the signal AIN on the output 203 in response to the control signal BGO14M. The output 203 is connected through an inverter 204 to supply the inverse address signal on line 205. The output 203 is connected to the series of inverters 206 and 207 to supply the address signal on line 208. The signals are supplied to the address decoder 13 for the first array 11.

FIG. 4 illustrates the multiplexer 33 which includes pass gates 220 and 221. The input to pass gate 220 is the registered address signal ACORE, and the input to pass gate 221 is the combinatorial address signal AIN. The first pass gate 220 includes a p-channel transistor in parallel within an n-channel transistor. The gate of the p-channel transistor is connected to the control signal BG02M, and the gate to the n-channel transistor is connected to the inverse of the control signal BG02M on the output of inverter 223.

The second pass gate 221 likewise includes a p-channel transistor in parallel with an n-channel transistor. The gate of the p-channel transistor is connected to the output of the inverter 223 and the gate of the n-channel transistor is connected to receive the control signal BG02M.

Thus, the multiplexer 33 operates to supply either the registered address signal ACORE or the combinatorial address signal AIN at the output 224 in response to the control signal BG02M.

The output 224 is connected to an inverter 225 which supplies the inverse of the address signal 226. The output 224 is also connected to the series of inverters 227 and 228 which supply the address signal on line 229. The address signals on lines 226 and 229 are supplied to the address decoder 22 for the second array 12.

According to the embodiments of FIGS. 2–4, when neither of the arrays 11, 12 is being programmed or erased, the signal ALD is low, which connects the output AIN of the logic gate 100 to the address register, so that the signals AIN and ACORE are equal. Also, the control signals BGO14M and BG02M are low. As a result, the outputs of both of the multiplexers 30, 33 are the registered address signal ACORE. Also in this case, the address supplied to the address decoders 13, 22 is the same as the address supplied to the command address decoder 45.

If one of the arrays is to be programmed or erased, the signal ALD is high, which disconnects the output of the logic gate 100 from the address register 31. In this case, only one of the control signals BGO14M and BG02M is low while the other is high.

The truth table for this embodiment is shown in TABLE 1.

TABLE 1

| BANK A | BANK B | BGO14M | BGO2M |
|---|---|---|---|
| Program/Erase | Program/Erase | GND | GND |
| Program/Erase | Read | GND | VDD |
| Read | Program/Erase | VDD | GND |
| Read | Read | GND | GND |

In an alternative embodiment, the truth table shown in TABLE 2 is implemented.

TABLE 2

| BANK A | BANK B | BGO14M | BGO2M |
|---|---|---|---|
| Program/Erase | Program/Erase | GND | GND |
| Program/Erase | Read | GND | VDD |
| Read | Program/Erase | VDD | GND |
| Read | Read | VDD | VDD |

The difference between the truth tables is in the fourth line, where both arrays are to be read. In the embodiment operating according to Table 2, when both arrays are in the read status, the address supplied to the command address decoder 45 comes from the registered address signal ACORE, while the address to the address decoders 13, 22 is the combinatorial address signal AIN.

Accordingly, the present invention provides an improved non-volatile memory device capable of read while write operation. The preferred embodiment comprises a flash memory device. However, other types of non-volatile memory devices, including non-volatile memory devices using floating gate devices or other storage cells can be used in other embodiments of the invention.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the appended claims.

What is claimed is:

1. A non-volatile memory device, comprising:

an integrated circuit substrate;

a first array of memory cells on the integrated circuit substrate;

a first address decoder, coupled to the first array of memory cells, including circuits for selecting memory cells in the first array for access in response to addresses;

a second array of memory cells on the integrated circuit substrate;

a second address decoder, coupled to the second array of memory cells, including circuits for selecting memory cells in the second array for access in response to addresses;

control logic and bias resources on the integrated circuit substrate, coupled to the first and second memory arrays, which execute a function to change data in one of the first and second arrays, and while executing said function, execute a read function for the other of the first and second array;

a set of address inputs on the integrated circuit substrate;

an address register. including an input and an output; and selector circuitry, including first circuits connected to the set of address inputs the input of the address register the first address decoder and the second address decoder and responsive to the control logic to connect the set of address inputs to a first selected target selected from targets including the input of the address register, the first address decoder and the second address decoder, and second circuits connected to the output of the address register, the first address decoder and the second address decoder and responsive to the control logic to connect the output of the address register to a second selected target selected from targets including the first address decoder and the second address decoder.

2. The non-volatile memory device of claim 1, wherein the function to change data includes a program function for the first array, and the first selected target is the second address decoder to supply address signals from the set of address inputs to the second array for the read function, and the second selected target is the first address decoder to supply an address stored in the address register for the program function.

3. The non-volatile memory device of claim 1, wherein the function to change data includes an erase function for the first array, and the first selected target is the second address decoder to supply address signals from the set of address inputs to the second array for the read function, and the second selected target is the first address decoder to supply an address stored in the address register for the erase function.

4. The non-volatile memory device of claim 1, including an address counter coupled to the address register, responsive to the control logic to supply a sequence of addresses to the address register for the function to change data.

5. The non-volatile memory device of claim 1, including command decoder logic coupled to the address register and to the control logic, responsive to addresses in the address register to identify the function to change data.

6. The non-volatile memory device of claim 1, wherein the selector circuitry includes:
- an address input switch, having a control input coupled to the control logic, an address input coupled to the set of address inputs, and having an output coupled to the address register, for connecting the set of address inputs to the address register in response to a signal on the control input;
- a first multiplexer, having a control input coupled to the control logic, having address inputs coupled to the set of address inputs and to the address register, and having an output coupled to the first address decoder, for supplying a selected one of the set of address inputs and to the address register to the first address decoder in response to a signal on the control input; and
- a second multiplexer, having a control input coupled to the control logic, having address inputs coupled to the set of address inputs and to the address register, and having an output coupled to the second address decoder, for supplying a selected one of the set of address inputs and to the address register to the second address decoder in response to a signal on the control input.

7. The non-volatile memory device of claim 1, wherein the non-volatile memory cells comprise floating gate transistors.

8. A non-volatile memory device, comprising:
- an integrated circuit substrate;
- a first array of floating gate memory cells on the integrated circuit substrate having a first address extent;
- a first address decoder, coupled to the first array of floating gate memory cells, including circuits responsive to addresses in the first address extent for selecting floating gate memory cells in the first array for access in response to addresses;
- a second array of floating gate memory cells on the integrated circuit substrate a second address extent;
- a second address decoder, coupled to the second array of floating gate memory cells, including circuits responsive to addresses in the second address extent for selecting floating gate memory cells in the second array for access in response to addresses;
- control logic and bias resources on the integrated circuit substrate, coupled to the first and second floating gate memory arrays, which execute program and erase functions to change data in one of the first and second arrays, and while executing said program and erase functions, execute a read function for the other of the first and second array;
- a set of address inputs on the integrated circuit substrate;
- an address register;
- an address input switch, having a switch control input coupled to the control logic, an address input coupled to the set of address inputs, and having an output coupled to the address register, for connecting the set of address inputs to the address register in response to a signal on the switch control input;
- command decoder logic coupled to the address register and to the control logic, responsive to addresses in the address register to identify one of the program and erase functions;
- a first multiplexer, having a first control input coupled to the control logic, having address inputs coupled to the set of address inputs and to the address register, and having an output coupled to the first address decoder, for supplying a selected one of the set of address inputs to the address register to the first address decoder in response to a signal on the first control input; and
- a second multiplexer, having a second control input coupled to the control logic, having address inputs coupled to the set of address inputs and to the address register, and having an output coupled to the second address decoder, for supplying a selected one of the set of address inputs and to the address register to the second address decoder in response to a signal on the second control input.

9. The integrated circuit of claim 8, wherein the address input switch comprises a plurality of circuits for respective address inputs in the set of address inputs, and circuits in the plurality include:
- a logic gate having a first input coupled to an enable signal and a second input coupled to an address input, and having an output; and
- a pass gate, having an input coupled to the output of the logic gate and an output coupled to the address register, responsive to the signal on the switch control input to connect the output of the logic gate to the address register or to disconnect the output of the logic gate from the address register.

10. The integrated circuit of claim 9, wherein the first multiplexer comprises:
- a first pass gate, having an input coupled to the output of the logic gate and an output coupled to the first address decoder, responsive to the signal on the first control input to connect the output of the logic gate to the first address decoder or to disconnect the output of the logic gate from the first address decoder; and
- a second pass gate, having an input coupled to the address register and an output coupled to the first address decoder, responsive to the signal on the first control input to connect the address register to the first address decoder or to disconnect the address register from the first address decoder.

11. The integrated circuit of claim 10, wherein the second multiplexer comprises:
- a third pass gate, having an input coupled to the output of the logic gate and an output coupled to the second address decoder, responsive to the signal on the second control input to connect the output of the logic gate to the second address decoder or to disconnect the output of the logic gate from the second address decoder; and
- a fourth pass gate, having an input coupled to the address register and an output coupled to the second address decoder, responsive to the signal on the second control input to connect the address register to the second address decoder or to disconnect the address register from the second address decoder.

12. A method for reading a first array of floating gate memory cells on an integrated circuit while changing data in a second array of floating gate memory cells on the same integrated circuit, comprising:
- receiving a command sequence to address inputs on the integrated circuit including commands and a first address identifying a location within the second array;

storing the first address in a register on the integrated circuit for use in a process for changing data in the second array;

executing the process for changing data under control of logic on the integrated circuit;

receiving on the address inputs on the integrated circuit, during execution of the process for changing data in the second array, an second address identifying a location in the first array;

applying the second address to the first array without storing the second address on the integrated circuit;

reading data at the location identified by the second address without storing the second address on the integrated circuit; and supplying the read data at an output on the integrated circuit without storing the second address on the integrated circuit; wherein the steps of applying the second address, reading data, and supplying read data at an output are performed during the execution of the process for changing data in the second array.

* * * * *